US008771416B2

(12) United States Patent
Saido et al.

(10) Patent No.: US 8,771,416 B2
(45) Date of Patent: Jul. 8, 2014

(54) SUBSTRATE PROCESSING APPARATUS WITH AN INSULATOR DISPOSED IN THE REACTION CHAMBER

(75) Inventors: Shuhei Saido, Toyama (JP); Takatomo Yamaguchi, Toyama (JP); Kenji Shirako, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1000 days.

(21) Appl. No.: 12/822,293

(22) Filed: Jun. 24, 2010

(65) Prior Publication Data

US 2011/0000425 A1  Jan. 6, 2011

(30) Foreign Application Priority Data

Jul. 2, 2009  (JP) ................................. 2009-157925
Apr. 27, 2010  (JP) ................................. 2010-101955

(51) Int. Cl.
*C30B 25/10* (2006.01)

(52) U.S. Cl.
USPC ............... 117/204; 117/84; 117/88; 117/200; 118/715; 118/719; 118/722; 118/724; 118/725; 118/728; 118/729; 118/730

(58) Field of Classification Search
USPC ............. 117/84, 88, 200, 204, 928, 935, 951; 118/715, 719, 722, 724–725, 728–730
See application file for complete search history.

(56) References Cited

U.S. PATENT DOCUMENTS

| 3,228,756 | A | * | 1/1966 | Hergenrother | ................ 117/109 |
| 4,579,080 | A | * | 4/1986 | Martin et al. | ................ 118/500 |
| 4,745,088 | A | * | 5/1988 | Inoue et al. | ..................... 117/98 |
| 6,932,872 | B2 | * | 8/2005 | Hamaguchi | .................. 118/725 |

FOREIGN PATENT DOCUMENTS

| JP | 03-072075 | 3/1991 |
| JP | 2006-196807 | 7/2006 |

* cited by examiner

*Primary Examiner* — Michael Kornakov
*Assistant Examiner* — Kenneth A Bratland, Jr.
(74) *Attorney, Agent, or Firm* — Brundidge & Stanger, P.C.

(57) ABSTRACT

A substrate processing apparatus comprises: a reaction chamber to process a substrate; a heating target object disposed in the reaction chamber to surround at least a region where the substrate is disposed, the heating target object having a cylindrical shape with a closed end; an insulator disposed between the reaction chamber and the heating target object to surround the heating target object, the insulator having a cylindrical shape with a closed end facing the closed end of the heating target object; an induction heating unit disposed outside the reaction chamber to surround at least the region where the substrate is disposed; a first gas supply system to supply at least a source gas into the reaction chamber; and a controller to control the first gas supply system so that the first gas supply system supplies at least the source gas into the reaction chamber for processing the substrate.

10 Claims, 14 Drawing Sheets

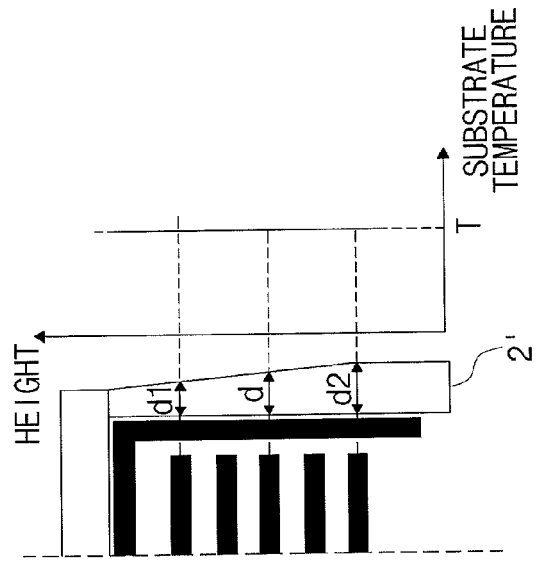
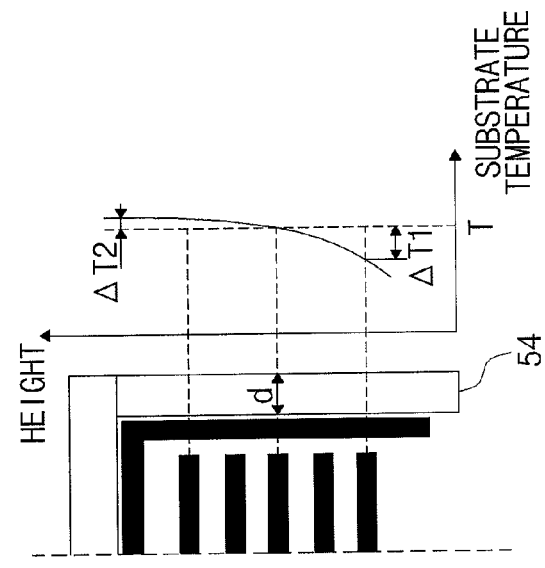
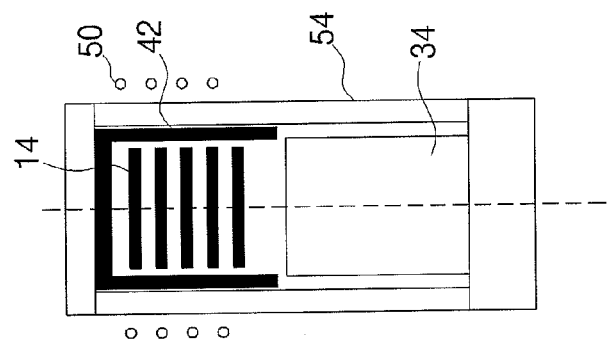

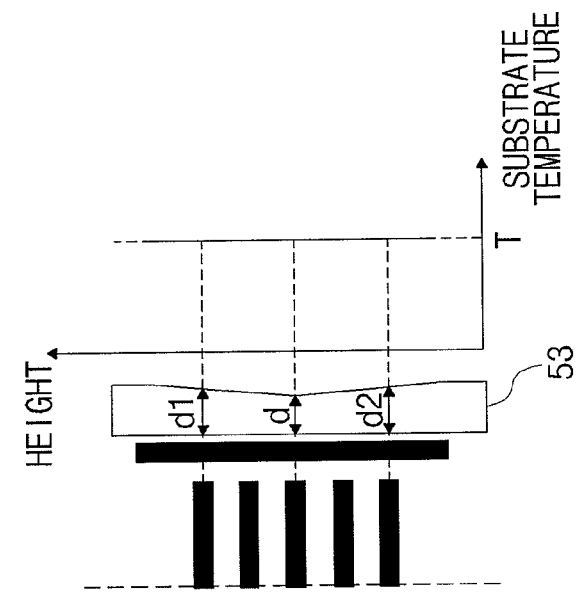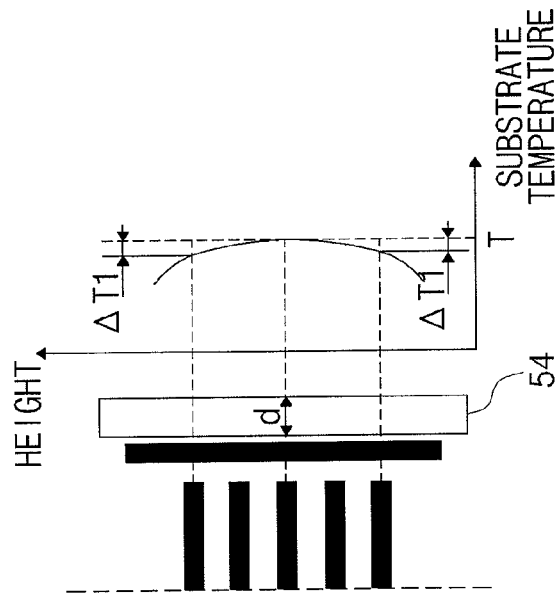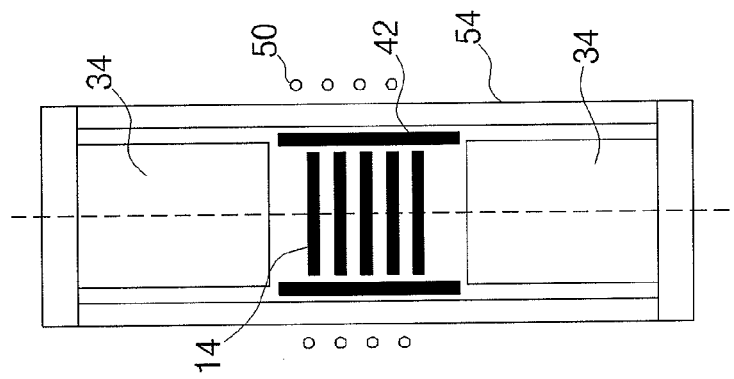

<PRIOR ART>

SUBSTRATE PROCESSING APPARATUS WITH AN INSULATOR DISPOSED IN THE REACTION CHAMBER

CROSS-REFERENCE TO RELATED PATENT APPLICATION

This U.S. non-provisional patent application claims priority under 35 U.S.C. §119 of Japanese Patent Applications No. 2009-157925 filed on Jul. 2, 2009 and No. 2010-101955 filed on Apr. 27, 2010, in the Japanese Patent Office, the entire contents of which are hereby incorporated by reference.

BACKGROUND OF THE INVENTION

1. Field of the Invention

The present invention relates to a method of manufacturing a semiconductor device, a method of manufacturing a substrate, and a substrate processing apparatus, which include a process of treating a substrate. More particular, the present invention relates to a method of manufacturing a semiconductor device, a method of manufacturing a substrate, and a substrate processing apparatus, which include a process of forming a silicon carbide (hereinafter referred to as SiC) epitaxial film on a substrate.

2. Description of the Related Art

SiC attracts attention as a material particularly for elements of a power device. However, it is known that it is difficult to make a crystalline substrate or device by using SiC as compared with the case of using silicon (hereinafter referred to as Si).

In a SiC film forming apparatus of the related art, a plurality of substrates are disposed on a plane of a plate-shaped susceptor and are heated to 1500° C. to 1800° C., and a source gas is supplied into a reaction chamber from one spot to form SiC epitaxial films on the substrates.

Patent Document 1 discloses a vacuum film forming apparatus and a thin film forming method, in which a susceptor is disposed in a manner such that a substrate holding surface of the susceptor faces downward so as to solve problems, such as adhesion of matters deposited on a surface facing the susceptor that is caused by a supply of the source gas, and unstable epitaxial growth of SiC caused by a convection flow of a source gas.

[Patent document] Japanese Application Publication No. 2006-196807

However, there are several problems in the related art. For example, in the case where a plurality of substrates are processed or substrates having a large diameter are processed as shown in FIG. 14, a susceptor having a large size and a reaction chamber having a large floor area are necessary. In addition, since a source gas is supplied into the reaction chamber through one spot, the concentration of the gas is not uniform throughout the reaction chamber, and thus the thickness of films formed on the substrates are not uniform. Furthermore, when SiC epitaxial films are grown, since the process temperature is high in the range from 1500° C. to 1800° C., it is difficult to control the in-surface temperature of wafers.

SUMMARY OF THE INVENTION

An object of the present invention is to provide a method of manufacturing a semiconductor device, a method of manufacturing a substrate, and a substrate processing apparatus, for uniformly forming films on a plurality of substrates in a SiC epitaxial film growing process performed at a high temperature.

According to an aspect of the present invention, there is provided a substrate processing apparatus comprising: a reaction chamber configured to process a substrate; a heating target object disposed in the reaction chamber to surround at least a region where the substrate is disposed, the heating target object having a cylindrical shape with a closed end; an insulator disposed between the reaction chamber and the heating target object to surround the heating target object, the insulator having a cylindrical shape with a closed end at a same side as the closed end of the heating target object; an induction heating unit disposed outside the reaction chamber to surround at least the region where the substrate is disposed; a first gas supply system configured to supply at least a source gas into the reaction chamber; and a controller configured to control the first gas supply system so that the first gas supply system supplies at least the source gas into the reaction chamber for processing the substrate.

According to another aspect of the present invention, there is provided a method of manufacturing a semiconductor device, the method comprising: loading a substrate into a cylindrical heating target object disposed in a cylindrical insulator installed in a reaction chamber, the heating target object having a closed end at a same side as a closed end of the cylindrical insulator; and processing the substrate by heating the heating target object using an induction heating unit installed around the reaction chamber while suppressing heat dissipation from the heating target object to an outside area by using the insulator, and by supplying at least a source gas into the heating target object.

According to another aspect of the present invention, there is provided a method of manufacturing a substrate, the method comprising: loading a substrate into a cylindrical heating target object disposed in a cylindrical insulator installed in a reaction chamber, the heating target object having a closed end at a same side as a closed end of the cylindrical insulator; and processing the substrate by heating the heating target object using an induction heating unit installed around the reaction chamber while suppressing heat dissipation from the heating target object to an outside area by using the insulator, and by supplying at least a source gas into the heating target object.

BRIEF DESCRIPTION OF THE DRAWINGS

FIG. 12A to FIG. 12C are views illustrating temperature distribution inside a process furnace 40 when an insulator 54 is disposed in a semiconductor manufacturing apparatus 10 according to a third embodiment of the present invention.

FIG. 13A to FIG. 13C are views illustrating temperature distribution inside the process furnace 40 when a modification example of the insulator 54 is disposed in the semiconductor manufacturing apparatus 10 according to the third embodiment of the present invention.

DETAILED DESCRIPTION OF THE PREFERRED EMBODIMENTS

First Embodiment

Figure 1:
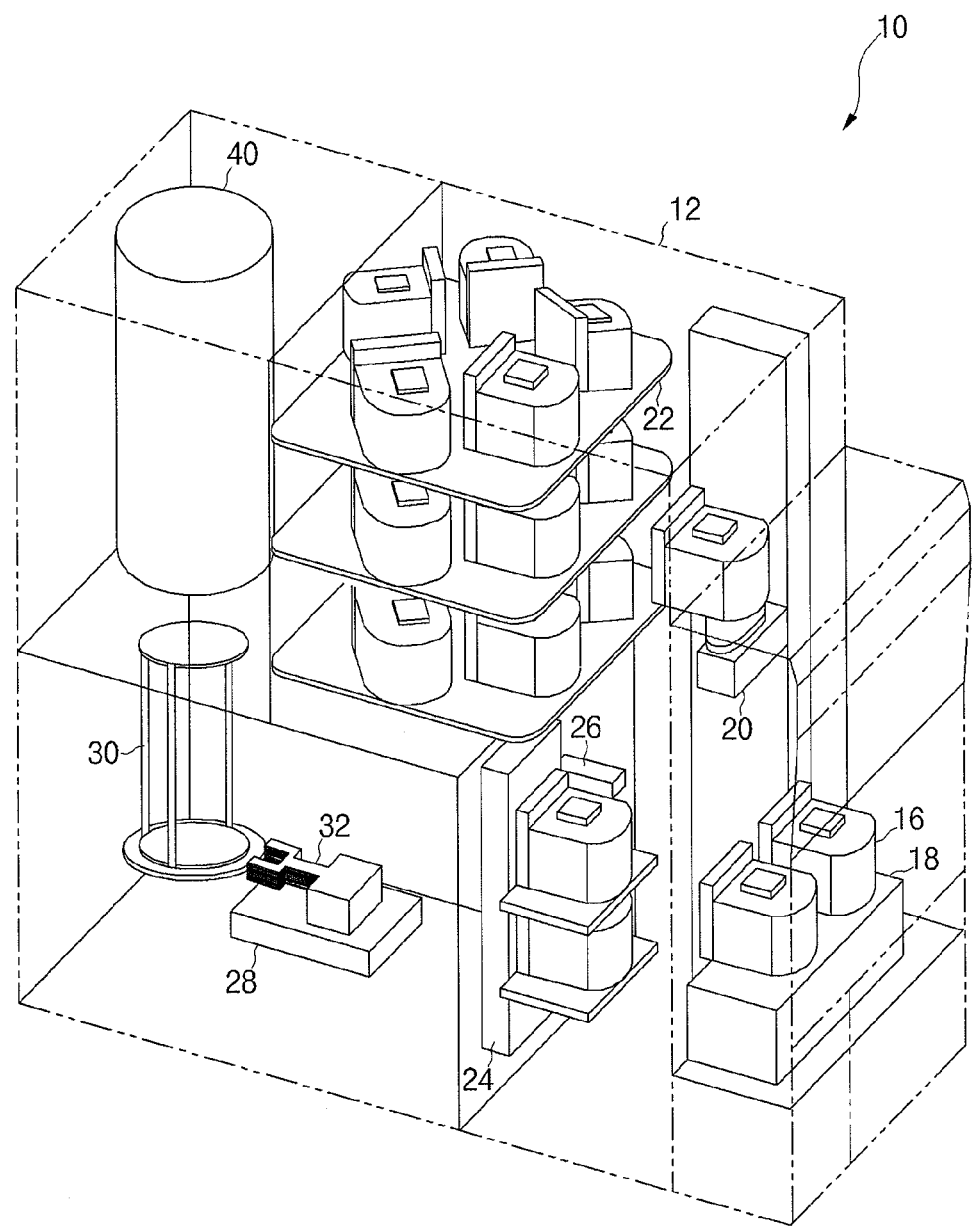
FIG. 1 is a perspective view illustrating a semiconductor manufacturing apparatus 10 according to an embodiment of the present invention.

Hereinafter, an embodiment of the present invention will be described with reference to the attached drawings. FIG. 1 is a perspective view illustrating an example of a semiconductor manufacturing apparatus 10 configured to form a SiC epitaxial film according to an embodiment of the present invention.

The semiconductor manufacturing apparatus 10 being a substrate processing apparatus is a batch type vertical heat treatment apparatus and includes a case 12 in which main parts are disposed. In the semiconductor manufacturing apparatus 10, FOUPs (Front Opening Unified Pods, hereinafter referred to as pods) 16, which are substrate containers configured to accommodate substrates such as wafers 14 made of Si or SiC, are used as wafer carriers. At the front side of the case 12, a pod stage 18 is disposed, and pods 16 are carried to the pod stage 18. For example, twenty five wafers 14 are accommodated in each pod 16, and the pod 16 is set on the pod stage 18 in a state where a cap of the pod 16 is closed.

At a front inner side of the case 12 facing the pod stage 18, a pod carrying device 20 is disposed. Furthermore, in the vicinity of the pod carrying device 20, a pod shelf 22, a pod opener 24, and a substrate counter 26 are disposed. The pod shelf 22 is disposed above the pod opener 24 and is configured such that a plurality of pods 16 can be placed and held on the pod shelf 22. The substrate counter 26 is disposed close to the pod opener 24. The pod carrying device 20 carries a pod 16 among the pod stage 18, the pod shelf 22, and the pod opener 24. The pod opener 24 is used to open a cap of a pod 16, and after the cap of the pod 16 is opened, the substrate counter 26 is used to count the number of wafers 14 disposed in the pod 16.

In the case 12, a substrate transfer machine 28 and a boat 30 being a substrate holding tool are disposed. The substrate transfer machine 28 includes an arm (tweezers) 32 and is configured to be vertically moved and horizontally rotated by a driving unit (not shown). The arm 32 can pick up wafers 14 (for example, five wafers 14), and by operating the arm 32, wafers 14 can be carried between a pod 16 placed on the pod opener 24 and the boat 30.

The boat 30 is made of a heat-resistant material such as carbon graphite or SiC and is configured to hold a plurality of vertically stacked wafers 14 in a manner such that the wafers 14 are horizontally oriented and vertically arranged with the centers of the wafers 14 being aligned with each other. In addition, at the lower part of the boat 30, a boat insulating part 34 is disposed as a circular disk shaped insulating member made of a heat-resistant material such as carbon graphite, quartz or SiC, so as to prevent heat transfer from a heating target object 48 (described later) to the lower side of a process furnace 40 (refer to FIG. 2).

At the rear upper part in the case 12, the process furnace 40 is disposed. The boat 30 in which a plurality of wafers 14 are held is loaded into the process furnace 40, and a heat treatment is performed.

Figure 2:
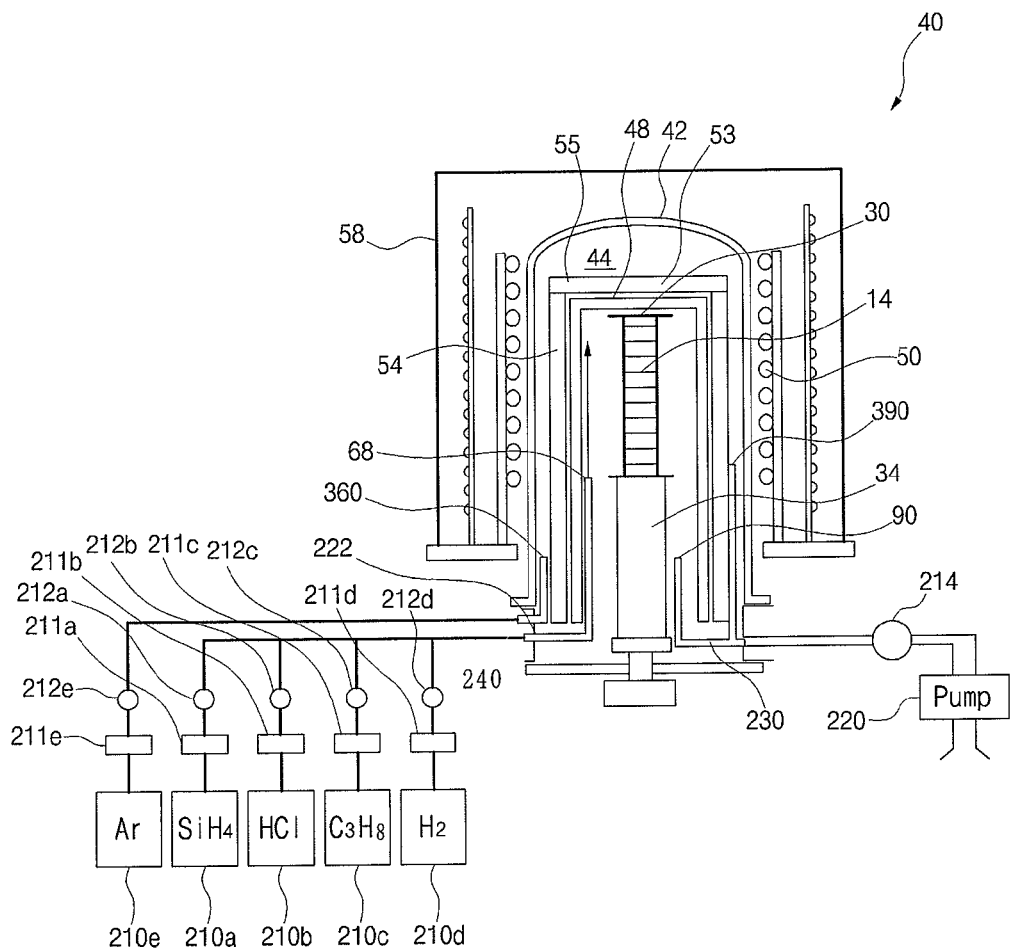
FIG. 2 is a side sectional view illustrating the semiconductor manufacturing apparatus 10 according to the embodiment of the present invention.

FIG. 2 is a side sectional view illustrating the process furnace 40 of the semiconductor manufacturing apparatus 10 configured to form a SiC epitaxial film. In FIG. 2, a first gas supply inlet 68 and a first exhaust outlet 90 are shown as representative examples, respectively. The first gas supply inlet 68 is configured to supply at least a gas containing Si (silicon) atoms, a gas containing chlorine (hereinafter referred to as CO atoms, a gas containing carbon (hereinafter referred to as C) atoms, and a reducing gas. In addition, a second gas supply inlet 360 and a second exhaust outlet 390 are shown, and the second gas supply inlet 360 is configured to supply inert gas between a reaction tube 42 forming a reaction chamber 44 and an insulator 53.

The process furnace 40 includes the reaction tube 42 that forms the cylindrical reaction chamber 44. The reaction tube 42 is made of a heat-resistant material such as quartz or SiC and has a cylindrical shape with a closed top side and an opened bottom side. The reaction chamber 44 is formed in the hollow part of the reaction tube 42 and is configured to accommodate vertically stacked substrates such as wafers 14 made of a material such as Si or SiC in a state where the wafers 14 are horizontally oriented and vertically arranged in the boat 30 with the centers of the wafers 14 being aligned with each other.

At the lower side of the reaction tube 42, a manifold is installed concentrically with the reaction tube 42. The manifold is made of a material such as stainless steel and has a cylindrical shape with opened top and bottom sides. The manifold is installed to support the reaction tube 42. In addition, between the manifold and the reaction tube 42, an O-ring is installed as a seal member. The manifold is supported by a holder (not shown) so that the reaction tube 42 can be vertically fixed. The reaction tube 42 and the manifold constitute a reaction vessel.

The process furnace 40 includes the heating target object 48 configured to be heated, and an induction heating source such as an induction heating coil 50 as a magnetic field generating unit. The heating target object 48 is disposed in the reaction chamber 44 and installed in a manner such that the heating target object 48 surrounds at least a region where substrates such as wafers 14 are arranged. The heating target object 48 is configured to be heated by a magnetic field generated by the induction coil 50 installed outside the reaction tube 42. As heat is generated by the heating target object 48, the inside of the reaction chamber 44 is heated.

The heating target object 48 has a cylindrical shape with a closed end (at an upper side in the drawing). Thus, supplied gas can be confined in the heating target object 48. In addition, heat dissipation through the upper part of the reaction chamber 44 can be suppressed.

In addition, it may be preferable that the induction coil 50 is installed up to a position higher than the ceiling of the heating target object 48. The reason for this is that heat is more easily dissipated through the ceiling of the heating target object 48 than through the sidewall of the heating target object 48. Particularly, heat is easily dissipated through the center of the ceiling of the heating target object 48. Owing this structure, these problems can be solved, and wafers 14 can be uniformly heated.

Near the heating target object 48, a temperature sensor (not shown) is installed as a temperature detector configured to detect the inside temperature of the reaction chamber 44. The induction coil 50 being an induction heating source, and the temperature sensor are electrically connected to a temperature control unit 52, and the temperature control unit 52 is configured to adjust power to the induction coil 50 based on temperature information detected by the temperature sensor so as to obtain predetermined temperature distribution in the reaction chamber 44 at a predetermined time (refer to FIG. 3).

Between the heating target object 48 and the reaction tube 42, the insulator 53 is installed, which is made of a material that is not easily induction-heated, such as carbon felt. Owing to the insulator 53, heat transfer from the heating target object 48 to the reaction tube 42 or the outside of the reaction tube 42 can be suppressed.

As shown in FIG. 2, the insulator 53 includes a sidewall part 54 having a cylindrical shape, and a cover part 55 configured to close one end of the insulator 53 (the upper end in the drawing). Owing to this structure, a hollow part can be provided in the insulator 53 by the sidewall part 54 and the cover part 55, and a process furnace structure in which the heating target object 48 is installed can be made. In addition, when a predetermined process is performed on substrates such as wafers 14 disposed in the heating target object 48 by heating the heating target object 48 using the induction coil 50, heat radiation from the heating target object 48 can be blocked by the insulator 53. Furthermore, the sidewall part 54 and the cover part 55 are made of different members. In this case, since the insulator 53 can be divided into the sidewall part 54 and the cover part 55, the insulator 53 can be easily manufactured, and thus the manufacturing costs of the insulator 53 can be reduced. In addition, since maintenance works (such as a part exchange work) can be easily carried out, apparatus running costs can be reduced.

In the current embodiment, so long as the insulator 53 has a cylindrical shape with a closed end at a position facing the closed end of the heating target object 48, the shape of the insulator 53 is not limited to a particular shape but can be varied. For example, the insulator 53 may have a closed top side in a manner such that the insulator 53 includes a cylindrical sidewall part and a cover part provided at an end of the sidewall part in one piece with the sidewall part.

In addition, it may be preferable that the cover part 55 of the insulator 53 has a greater thickness at its center part than at its peripheral part. In this case, heat dissipation through the upper center part of a closed part of the heating target object 48 can be reduced, and since the center part of the top side of the heating target object 48 can be more easily heated than the peripheral part of the top side of the heating target object 48, the temperature of a region where wafers 14 are disposed can be more easily controlled. In addition, since radiation heat through the top side of the heating target object 48 can be reduced, the reaction tube 42 installed outside the insulator 53 can be less deteriorated by the radiation heat.

In addition, it may be preferable that the induction coil 50 is installed up to a position higher than the cover part 55 of the insulator 53. Owing this structure, wafers 14 can be uniformly heated. In addition, since the heating target object 48 installed in the insulator 53 can be entirely surround and the closed part of the heating target object 48 can be sufficiently heated, the temperature of the region where wafers 14 are disposed can be easily controlled.

It may be preferable to change an interval of the induction coil 50 installed around the reaction tube 42 according to a position of the induction coil 50. In this way, the density of induced current can be controlled to control the temperature of the wafer disposition region more easily, and thus the temperature of the wafer disposition region can be kept more uniformly.

It may be more preferable that the thickness of the sidewall part 54 of the insulator 53 is thick at a region where the induction coil 50 is densely installed. In this case, heat radiation to an outside area from a region of the heating target object 48 where the induction coil 50 is densely installed can be reduced, and thus the reaction tube 42 installed outside the insulator 53 can be prevented from being locally deteriorated.

Furthermore, in the current embodiment, it may be preferable that the amount of thermal energy at the cover part 55 or the opened lower side of the insulator 53 is greater than the amount of thermal energy at the region where wafers 14 are disposed. For example, the induction coil 50 may be installed in a manner such that the induction coil 50 is more dense at the cover part 55 or the lower side of the insulator 53 that at the region where wafers 14 are disposed. In this case, the induction coil 50, which is an induction heating unit, can surround the entire region of the heating target object 48 installed inside the insulator 53 so as to heat the closed part of the heating target object 48 sufficiently, and by controlling the winding density of the induction coil 50, the temperature of the region where wafers 14 are disposed can be uniformly kept from upper side to lower side so that the temperature controllability of the region where wafers 14 are disposed can be improved.

In the current embodiment, it may be more preferable that the amount of thermal energy at the opened lower side of the insulator 53 is greater than the amount of thermal energy at the cover part 55 of the insulator 53. For example, the induction coil 50 may be installed in a manner such that the induction coil 50 is denser at the opened lower side of the insulator 53 than at the cover part 55 of the insulator 53. In this case, the induction coil 50, which is an induction heating unit, can surround the entire region of the heating target object 48 installed inside the insulator 53 so as to heat the closed part of the heating target object 48 sufficiently, and by controlling the winding density of the induction coil 50, the temperature of the region where wafers 14 are disposed can be uniformly kept from the upper side to the lower side of the region so that the temperature controllability of the region where wafers 14 are disposed can be improved.

Figure 4:
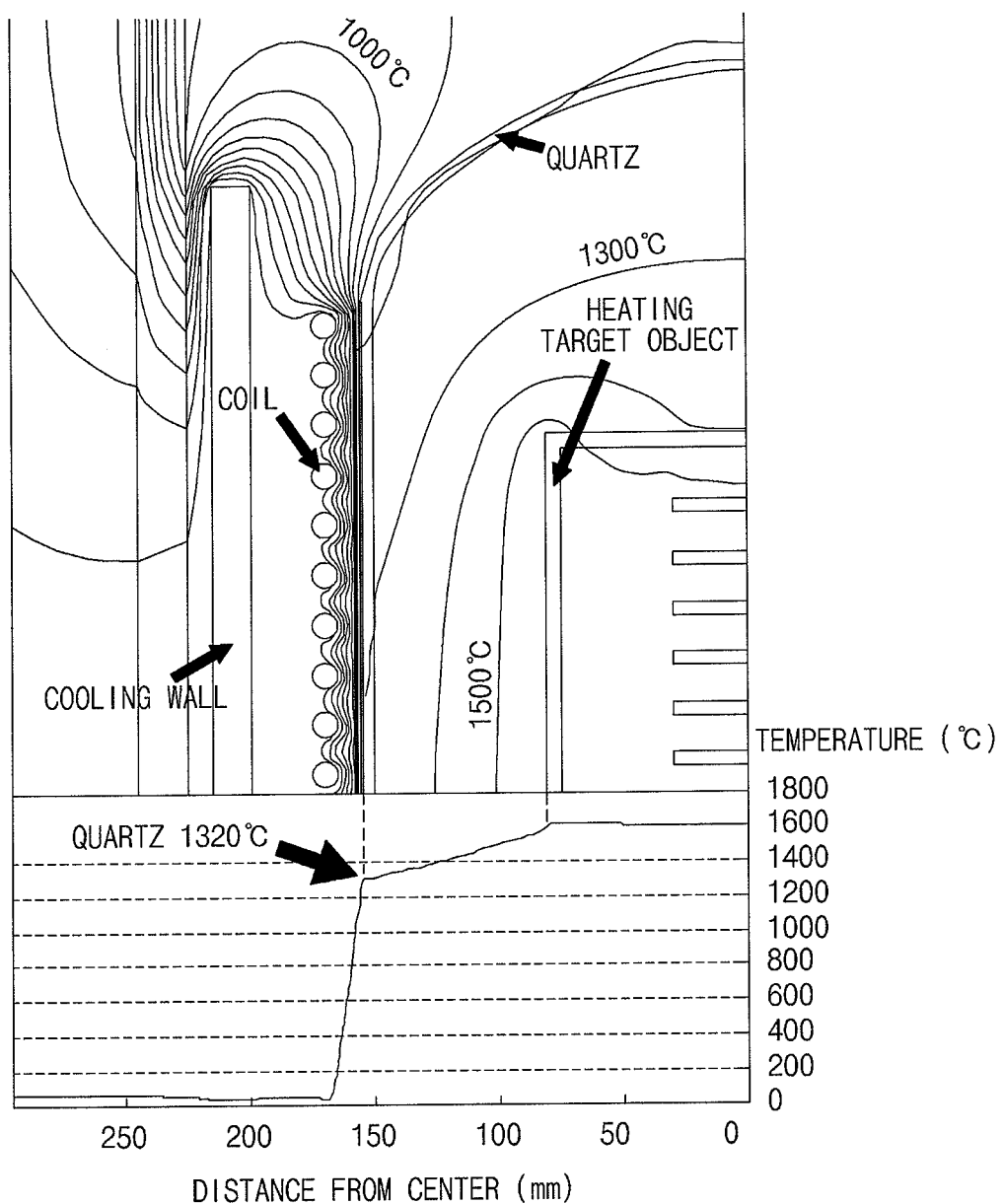
FIG. 4 is view illustrating a calculated temperature distribution in a process furnace 40 when an insulator 54 is not installed between a heating target object 48 and a reaction tube 42 in the semiconductor manufacturing apparatus 10 of the embodiment of the present invention.
Figure 5:
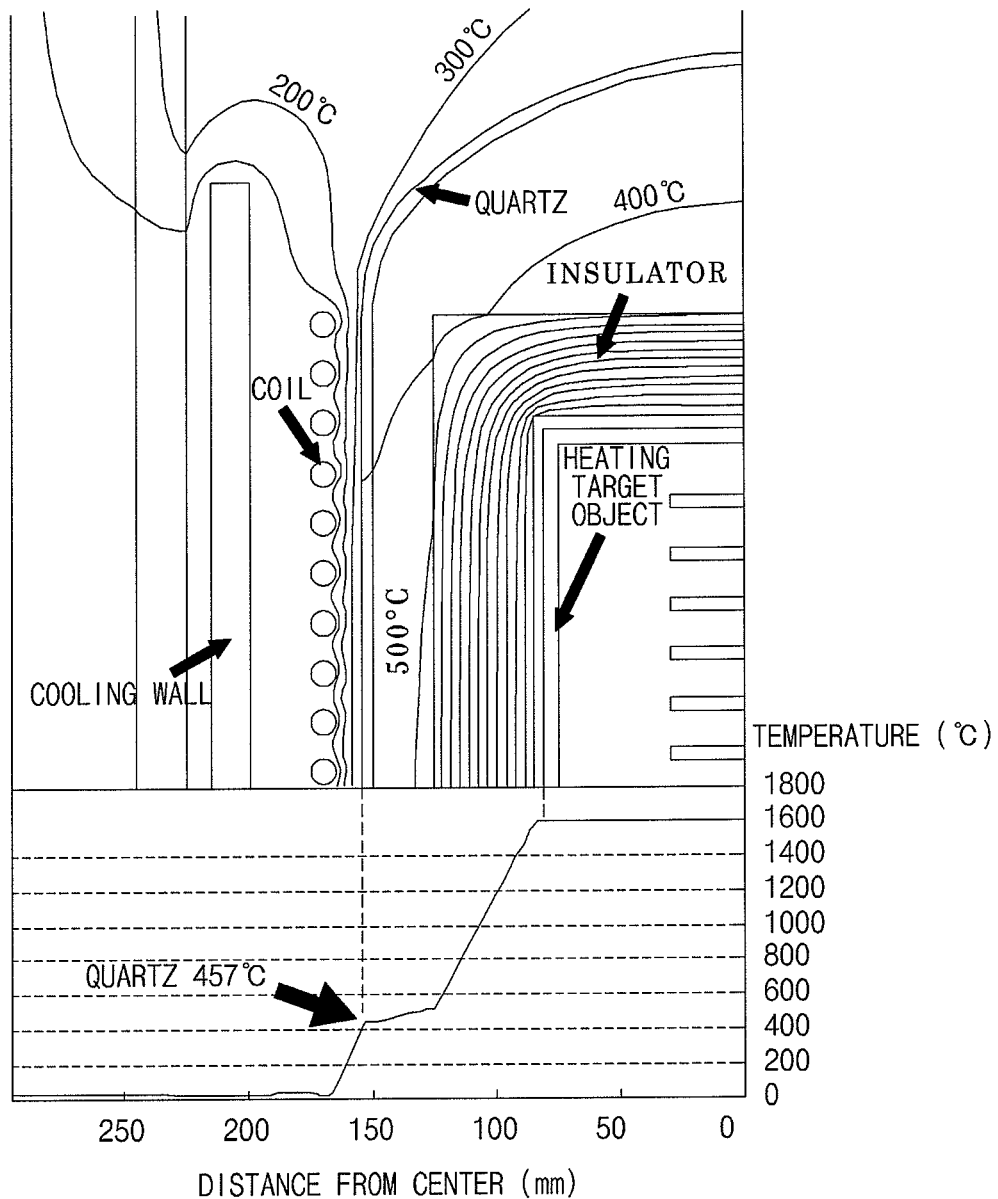
FIG. 5 is view illustrating a calculated temperature distribution in the process furnace 40 when the insulator 54 is installed between the heating target object 48 and the reaction tube 42 in the semiconductor manufacturing apparatus 10 of the embodiment of the present invention.

FIG. 4 illustrates a calculated temperature distribution in the case when the insulator 53 is not installed between the heating target object 48 and the reaction tube 42, and FIG. 5 illustrates a calculated temperature distribution when the insulator 53 is installed between the heating target object 48 and the reaction tube 42. The upper regions of FIG. 4 and FIG. 5 show partial sectional views of the reaction chamber 44, and curves of FIG. 4 and FIG. 5 show temperature distribution in the reaction chamber 44. Furthermore, in the lower parts of FIG. 4 and FIG. 5, relationships between temperatures of parts and distances to the parts from the center of wafers 14 are illustrated, and the horizontal axes denote the distance from the wafers 14 and the vertical axes denote the temperatures of the parts.

Referring to FIG. 4, that is, in the case where the insulator 53 is not provided, if the temperature of the wafers 14 reaches a predetermined level (for example, 1600° C.), due to heat transfer from the heating target object 48 to the reaction tube 42 or the outside of the reaction tube 42, the temperature of the reaction tube 42 becomes 1320° C. In this case, if the reaction tube 42 is made of a material such as quartz, the reaction tube 42 is deteriorated.

Referring to FIG. 5, that is, in the case where the insulator 53 is installed between the reaction tube 42 and the heating target object 48, although the temperature of the wafers 14 reaches a predetermined level (for example, 1600° C.), since heat transfer from the heating target object 48 is blocked by the insulator 53, the temperature of the reaction tube 42 can be kept at 457° C.

In this way, heat transfer to the reaction tube 42 or the outside of the reaction tube 42 can be suppressed, and thus deterioration of the reaction tube 42 can be prevented although the reaction tube 42 is made of a material such as quartz.

Figure 6:
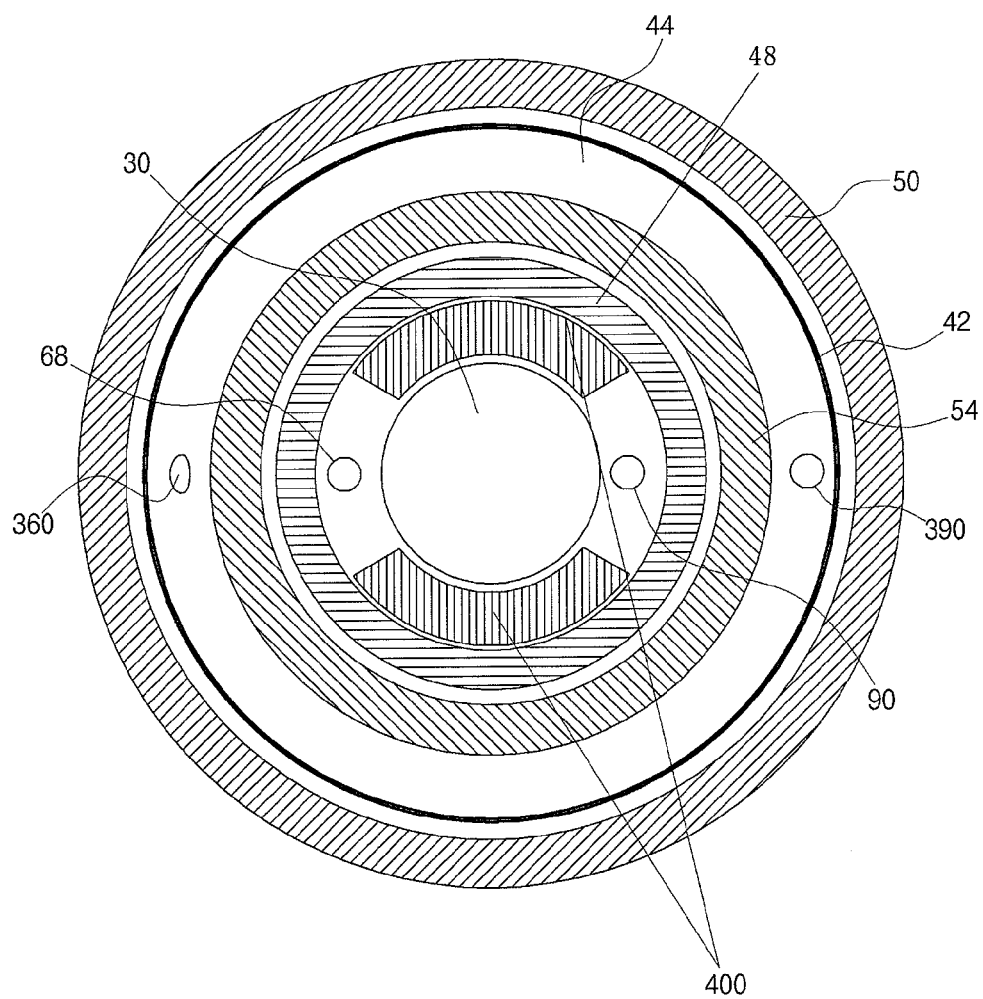
FIG. 6 is a cross-sectional view illustrating an upper part of the process furnace 40 of the semiconductor manufacturing apparatus 10 according to the embodiment of the present invention.

In addition, at the outside of the induction coil 50, an outer insulating wall having a structure such as a water cooling structure is installed in a manner such that the outer insulating wall surrounds the reaction chamber 44 so as to prevent heat transfer from the inside of the reaction chamber 44 to an outside area. In addition, at the outside of the outer insulating wall, an electric field seal 58 is installed to prevent leakage of a magnetic field generated by the induction coil 50 to an outside area (refer to FIG. 2). As shown in FIG. 2 and FIG. 6, the first gas supply inlet 68 and the first exhaust outlet 90 are disposed between the heating target object 48 and the wafers 14. The first gas supply inlet 68 is configured to supply at least a gas containing Si (silicon) atoms, a gas containing Cl (chlorine) atoms, a gas containing C (carbon) atoms, and a reducing gas. The second gas supply inlet 360 and the second exhaust outlet 390 are disposed between the reaction tube 42 and the insulator 53. These will now be described.

The first gas supply inlet 68 is configured to supply at least a gas containing Si (silicon) atoms such as monosilane (hereinafter referred to as $SiH_4$) gas, a gas containing Cl (chlorine) atoms such as hydrogen chloride (hereinafter referred to as HCl) gas, a gas containing C (carbon) atoms such as propane (hereinafter referred to as $C_3H_8$) gas, and a reducing gas such as hydrogen (hereinafter referred to as $H_2$) gas. The first gas supply inlet 68 is made of a material such as carbon graphite and is installed inside the heating target object 48 in a manner such that the first gas supply inlet 68 is mounted on the manifold so as to penetrate the manifold.

The first gas supply inlet 68 is connected to a first gas line 222. For supplying gases such as $SiH_4$ gas, HCl gas, $C_3H_8$ gas, and $H_2$ gas, the first gas line 222 is connected to, for example, a $SiH_4$ gas source 210a, a HCl gas source 210b, a $C_3H_8$ gas source 210c, and a $H_2$ gas source 210d through flow rate control units (flow rate control devices) such as mass flow controllers (hereinafter referred to as MFCs) 211a, 211b, 211c, and 211d; and valves 212a, 212b, 212c, and 212d.

Owing to this structure, the flow rates, concentrations, and partial pressures of gases such as $SiH_4$ gas, HCl gas, $C_3H_8$ gas, and $H_2$ gas can be individually controlled. The valves 212a, 212b, 212c, and 212d, and the MFCs 211a, 211b, 211c, and 211d are electrically connected to a gas flow rate control unit 78, so that the supply flow rates of the gases can be individually controlled to predetermined levels at predetermined times (refer to FIG. 3). A first gas supply system is constituted by the gas sources 210a, 210b, 210c, and 210d for such gases as $SiH_4$ gas, HCl gas, $C_3H_8$ gas, and $H_2$ gas; the valves 212a, 212b, 212c, and 212d; the MFCs 211a, 211b, 211c, and 211d; the gas line 222; and the first gas supply inlet 68.

Although at least a gas containing Si (silicon) atoms, a gas containing Cl (chlorine) atoms, a gas containing C (carbon) atoms, and a reducing gas are supplied through the first gas supply inlet 68, the present invention is not limited thereto. For example, gas supply inlets may be provided to supply such gases, respectively, or gas supply inlets may be provided to supply combinations of such gases.

In addition, although HCl gas is mentioned as an example of a gas containing Cl (chlorine) atoms, another gas such as $Cl_2$ gas (chlorine gas) may be used.

Furthermore, in the above description, a gas containing Si (silicon) atoms and a gas containing Cl (chlorine) atoms are supplied. However, a gas containing Si (silicon) atoms and Cl (chlorine) atoms such as tetrachlorosilane (hereinafter referred to as $SiCl_4$) gas, trichlorosilane (hereinafter referred to as $SiHCl_3$) gas, or dichlorosilane (hereinafter referred to as $SiH_2Cl_2$) gas may be supplied.

Furthermore, although $C_3H_8$ gas is mentioned as an example of a gas containing C (carbon) atoms, another gas such as ethylene (hereinafter referred to as $C_2H_4$) gas or acetylene (hereinafter referred to as $C_2H_2$) gas may be used.

In addition, a dopant gas may be further supplied through the first gas supply inlet 68, or another gas supply inlet may be provided to supply a dopant gas.

The first exhaust outlet 90 is disposed at a position opposite to the first gas supply inlet 68, and a gas exhaust pipe 230 connected to the first exhaust outlet 90 is installed through the manifold. A vacuum exhaust device 220 such as a vacuum pump is connected to the downstream side of the gas exhaust pipe 230 through a pressure detector (not shown) such as a pressure sensor and a pressure regulator such as an automatic pressure controller (hereinafter referred to as APC) valve 214. The pressure sensor and the APC valve 214 are electrically connected to a pressure control unit 98, and the pressure control unit 98 is configured to adjust the opening degree of the APC valve 214 based on pressures detected by the pressure sensor for controlling the pressure inside the heating target object 48 to a predetermined level at a predetermined time (refer to FIG. 3).

In this structure, at least a gas containing Si (silicon) atoms, a gas containing Cl (chlorine) atoms, a gas containing C (carbon) atoms, and a reducing gas are supplied from the first gas supply inlet 68, and the supplied gases flow in parallel with the wafers 14 made of Si or SiC toward the first exhaust outlet 90 so that all the wafers 14 can be exposed to the gases efficiently and uniformly.

Furthermore, preferably, as shown in FIG. 6, in the reaction chamber 44, structures 400 may be installed at positions between the first gas supply inlet 68 and the first exhaust outlet 90. For example, the structures 400 may be disposed at opposite positions. Preferably, the structures 400 may be made of an insulating material or carbon graphite for resisting heat and preventing generation of particles. By this, the entire area of the wafers 14 can be efficiently and uniformly exposed to gases supplied through the first gas supply inlet 68, and thus the thickness of SiC epitaxial films formed on the wafers 14 can be more uniform.

The second gas supply inlet 360 is disposed between the reaction tube 42 and the insulator 53 and is installed through the manifold. The second exhaust outlet 390 is disposed between the reaction tube 42 and the insulator 53 at a position opposite to the second gas supply inlet 360, and the gas exhaust pipe 230 connected to the second exhaust outlet 390 is installed through the manifold. Inert gas such as argon (hereinafter referred to as Ar) gas is supplied through the second gas supply inlet 360, so that gases contributing to formation of SiC epitaxial films such as a gas containing Si (silicon) atoms, a gas containing C (carbon) atoms, a gas containing Cl (chlorine) atoms, or a mixture thereof can be prevented from permeating between the reaction tube 42 and the insulator 53, and adhesion of unnecessary matters to the inner wall of the reaction tube 42 or the outer wall of the insulator 53 can be prevented.

Inert gas supplied between the reaction tube 42 and the insulator 53 is exhausted from the second exhaust outlet 390 to the vacuum exhaust device 220 such as the vacuum pump through the pressure detector (not shown) such as the pressure sensor, and the pressure regulator such as the APC valve 214 that are provided at the downstream side of the gas exhaust pipe 230. The pressure sensor and the APC valve 214 are electrically connected to a pressure control unit 98, and the pressure control unit 98 is configured to adjust the opening degree of the APC valve 214 based on pressures detected by the pressure sensor between the reaction tube 42 and the insulator 53 to a predetermined level at a predetermined time (refer to FIG. 3).

Although Ar gas is mentioned as an example of inert gas, the present invention is not limited thereto. For example, at least one of rare gases such as helium (hereinafter referred to as He) gas, neon (hereinafter referred to as Ne) gas, krypton (hereinafter referred to as Kr) gas, and xenon (hereinafter referred to as Xe) gas may be supplied; or a gas mixed with at least one of such rare gases may be supplied.

Next, the surrounding structures of the process furnace 40 will be described.

Figure 7:
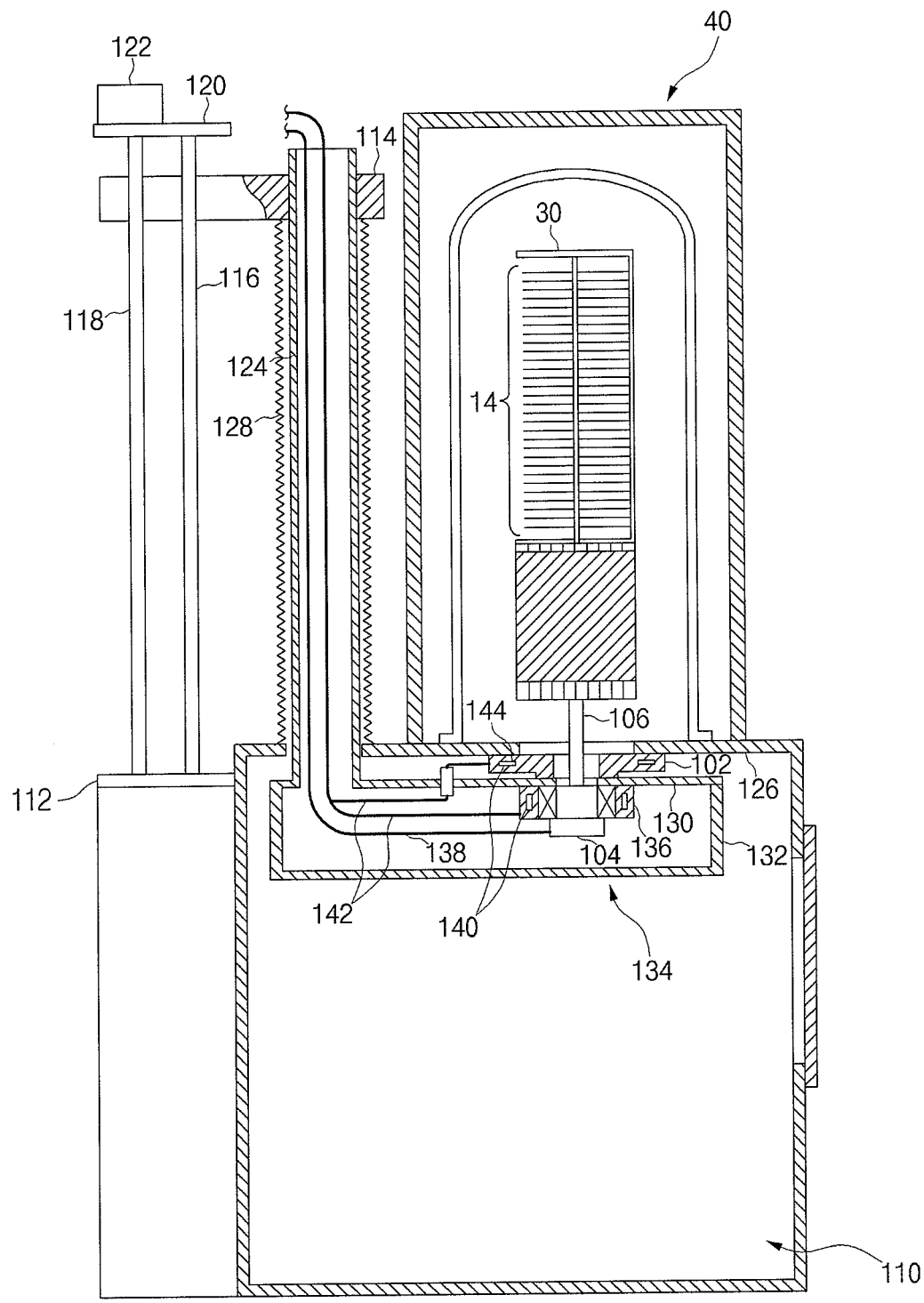
FIG. 7 is a schematic view illustrating the process furnace 40 of the semiconductor manufacturing apparatus 10 and the surrounding structures of the process furnace 40 according to the embodiment of the present invention.

FIG. 7 is a schematic view illustrating the process furnace 40 and the surrounding structures of the process furnace 40. At the bottom side of the process furnace 40, a seal cap 102 is installed as a furnace port cover to hermetically close the bottom-side opening of the process furnace 40. The seal cap 102 is made of a material such as stainless steel and has a circular disk shape. On the top surface of the seal cap 102, an O-ring is installed as a seal member configured to make contact with the bottom side of the process furnace 40. At the seal cap 102, a rotary mechanism 104 is installed. A rotation shaft 106 of the rotary mechanism 104 is connected to the boat 30 through the seal cap 102 and is configured to rotate wafers 14 by rotating the boat 30. The seal cap 102 is configured to be vertically lifted and lowered by an elevating motor 122 (described later) installed at the outside of the process furnace 40 as an elevating mechanism, so as to load the boat 30 into the process furnace 40 and unload the boat 30 from the process furnace 40. The rotary mechanism 104 and the elevating motor 122 are electrically connected to a driving control unit 108, and thus predetermined operations can be performed at predetermined times under the control of the driving control unit 108 (refer to FIG. 3).

At the outer surface of a loadlock chamber 110 which is a preliminary chamber, a lower base plate 112 is installed. A guide shaft 116 fitted in an elevating table 114, and a ball screw 118 screw-coupled to the elevating table 114 are installed at the lower base plate 112. On the upper ends of the guide shaft 116 and the ball screw 118 erected on the lower base plate 112, an upper base plate 120 is installed. The ball screw 118 is rotated by the elevating motor 122 installed on the upper base plate 120. As the ball screw 118 is rotated, the elevating table 114 is lifted or lowered.

At the elevating table 114, a hollow elevating shaft 124 is installed to be vertically extended from the elevating table 114, and a joint part between the elevating table 114 and the elevating shaft 124 is hermetically sealed. The elevating shaft 124 is configured to be lifted and lowered together with the elevating table 114. The elevating shaft 124 is movably inserted through a top plate 126 of the loadlock chamber 110. A penetration hole of the top plate 126 through which the elevating shaft 124 is movably inserted is sufficiently large so that the elevating shaft 124 does not make contact with the top plate 126 at the penetration hole. Between the loadlock chamber 110 and the elevating table 114, a bellows 128 is installed to enclose the elevating shaft 124 as a hollow stretchy part, so that the loadlock chamber 110 can be hermetically sealed. The bellows 128 can be sufficiently expanded and contracted in accordance with lifting and lowering motions of the elevating table 114, and the bellows 128 has an inner diameter sufficiently greater than the outer diameter of the elevating shaft 124 so as not to make contact with the elevating shaft 124 during expansion or contraction.

An elevating base plate 130 is horizontally fixed to the lower end of the elevating shaft 124. A driving unit cover 132 is hermetically attached to the bottom surface of the elevating base plate 130 with a seal member such as an O-ring being disposed therebetween. The elevating base plate 130 and the driving unit cover 132 constitute a driving unit accommodation case 134. In this structure, the inside of the driving unit accommodation case 134 is isolated from the inside atmosphere of the loadlock chamber 110.

In addition, the rotary mechanism 104 for the boat 30 is installed in the driving unit accommodation case 134, and the periphery of the rotary mechanism 104 is cooled by a cooling mechanism 136.

A power supply cable 138 extends from the upper end of the elevating shaft 124 to the rotary mechanism 104 through the hollow part of the elevating shaft 124, and then the power supply cable 138 is connected to the rotary mechanism 104. In addition, cooling channels 140 are formed in the cooling mechanism 136 and the seal cap 102. Coolant conduits 142 extend from the upper end of the elevating shaft 124 to the cooling channels 140 through the hollow part of the elevating shaft 124, and then the coolant conduits 142 are connected to the cooling channels 140.

By rotating the ball screw 118 using the elevating motor 122, the driving unit accommodation case 134 can be lifted or lowered through the elevating table 114 and the elevating shaft 124.

If the driving unit accommodation case 134 is lifted, a furnace port 144 which is an opening of the process furnace 40 is closed by the seal cap 102 hermetically installed on the elevating base plate 130, and thus a wafer processible state can be made. If the driving unit accommodation case 134 is lowered, the boat 30 is also lowered together with the seal cap 102, and in this state, wafers 14 can be carried to an outside area.

Figure 3:
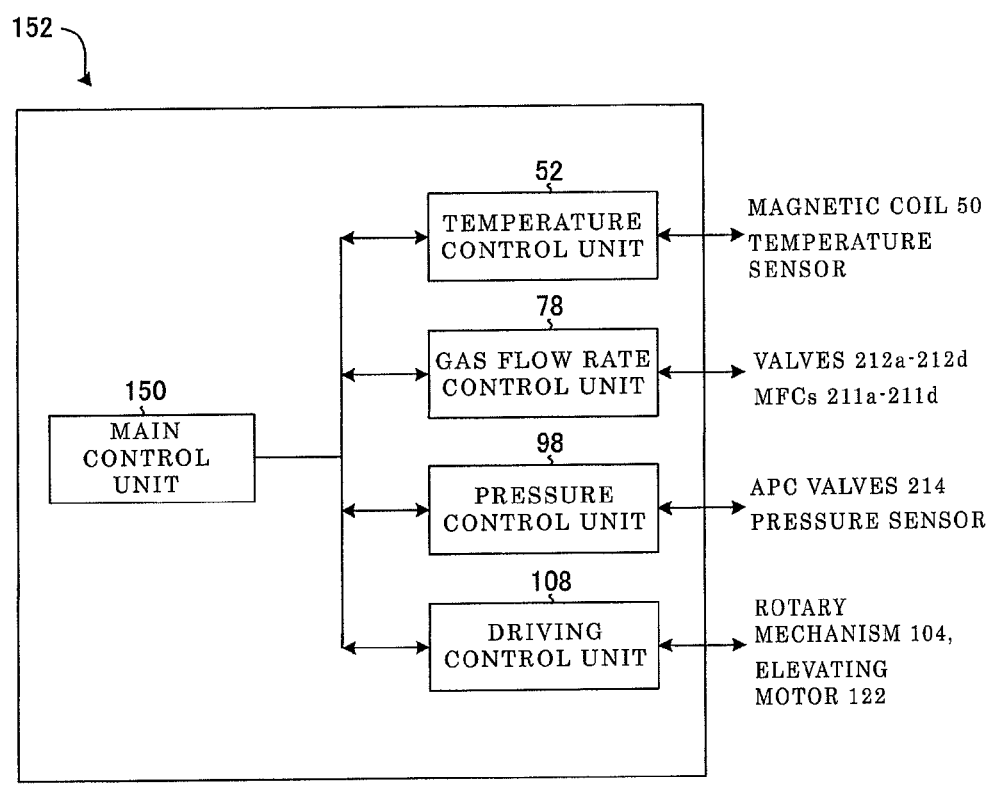
FIG. 3 is a view illustrating a configuration for controlling parts of the semiconductor manufacturing apparatus 10 according to the embodiment of the present invention.

FIG. 3 is a view illustrating a configuration for controlling parts of the semiconductor manufacturing apparatus 10 configured to form a silicon carbide epitaxial film. The temperature control unit 52, the gas flow rate control unit 78, the pressure control unit 98, and the driving control unit 108 constitute a manipulation unit and an input/output unit and are electrically connected to a main control unit 150 that controls the overall operation of the semiconductor manufacturing apparatus 10. The temperature control unit 52, the gas flow rate control unit 78, the pressure control unit 98, and the driving control unit 108 are configured as a controller 152.

Next, an explanation will be given on a method of forming a SiC film on a substrate such as a SiC wafer 14 by using the above-described semiconductor manufacturing apparatus 10 in one of semiconductor device manufacturing processes. In the following explanation, each part of the semiconductor manufacturing apparatus 10 is controlled by the controller 152.

First, if a pod 16 accommodating a plurality of wafers 14 is set on the pod stage 18, the pod carrying device 20 carries the pod 16 from the pod stage 18 to the pod shelf 22 so that the pod shelf 22 can be stocked with the pod 16. Next, the pod carrying device 20 carries the pod 16 from the pod shelf 22 to the pod opener 24 and sets the pod 16 on the pod opener 24; the pod opener 24 opens a cap of the pod 16; and the substrate counter 26 detects the number of the wafers 14 accommodated in the pod 16.

Next, the substrate transfer machine 28 picks up wafers 14 from the pod 16 placed on the pod opener 24 and transfers the wafers 14 to the boat 30.

After a plurality of wafers 14 are charged into the boat 30, the boat 30 in which the wafers 14 are held is loaded into the reaction chamber 44 (boat loading) as the elevating table 114 and the elevating shaft 124 are lifted by the elevating motor 122. At this time, the bottom side of the manifold is sealed by the seal cap 102 in a state where the O-ring being disposed between the manifold and the seal cap 102.

The inside of the heating target object 48 is vacuum-evacuated by the vacuum exhaust device 220 to a predetermined pressure (vacuum degree). At this time, the inside pressure of the heating target object 48 is measured using the pressure sensor, and based on the measured pressure, the APC valve 214 communicating with the first exhaust outlet 90 and the second exhaust outlet 390 is feedback-controlled. In addition, the wafers 14 and the inside of the heating target object 48 are heated by the induction coil 50 which is an induction heating source to a predetermined temperature. At this time, to obtain desired temperature distribution in the heating target object 48, power to the induction coil 50 is feedback-controlled based on temperature information detected by the temperature sensor. Subsequently, the rotary mechanism 104 rotates the boat 30 to rotate the wafers 14 charged in the boat 30.

Next, for a SiC epitaxial growth reaction, a gas containing Si (silicon) atoms, a gas containing Cl (chlorine) atoms, a gas containing C (carbon) atoms, and a reducing gas such as $H_2$ gas are supplied respectively from the gas sources 210a, 210b, 210c, and 210d, and the gases are ejected to the inside of the heating target object 48 through at least one first gas supply inlet 68 installed at the inside the heating target object 48, so that a SiC epitaxial growth reaction can occur.

At this time, to adjust the flowrates of the gas containing Si (silicon) atoms, the gas containing Cl (chlorine) atoms, the gas containing C (carbon) atoms, and the reducing gas such as $H_2$ gas to predetermined levels, the opening degrees of the corresponding MFCs 211a, 211b, 211c, and 211d are adjusted, and then the valves 212a, 212b, 212c, and 212d are opened, so that the respective gases can be supplied into the heating target object 48 through the gas supply pipe 222 and the first gas supply inlet 68.

The gases supplied through the first gas supply inlet 68 are allowed to flow through the inside of the heating target object 48 of the reaction chamber 44, and the gases are discharged through the first exhaust outlet 90 and the gas exhaust pipe 230. When the gases flow through the inside of the heating target object 48, the gases make contact with the wafers 14 so that SiC epitaxial films can be grown on the surfaces of the wafers 14.

In addition, inert gas such as Ar gas is supplied from a gas supply source 210e. To adjust the flow rate of the inert gas to a predetermined level, the opening degree of a corresponding MFC 211e is adjusted, and then a valve 212e is opened so that the inert gas can be supplied between the reaction tube 42 and the insulator 53 through a gas supply pipe 240 and the second gas supply inlet 360. The Ar gas (insert gas) supplied through the second gas supply inlet 360 is allowed to flow between the insulator 53 and the reaction tube 42 in the reaction chamber 44 and is discharged through the second exhaust outlet 390.

After a predetermined time, supply of the gases is terminated, and inert gas is supplied from an inert gas supply source (not shown) to replace the inside atmosphere of the heating target object 48 with the inert gas and adjust the inside pressure of the reaction chamber 44 back to atmospheric pressure.

Thereafter, the seal cap 102 is lowered by the elevating motor 122 to open the bottom side of the manifold, and along with this, the processed wafers 14 are unloaded from the reaction tube 42 through the bottom side of the manifold in a state where the processed wafers 14 are held in the boat 30 (boat unloading), and the boat 30 is left at a predetermined position until all the wafers 14 held in the boat 30 are cooled. Next, if the wafers 14 of the boat 30 are cooled to a predetermined temperature, the substrate transfer machine 28 picks up the wafers 14 from the boat 30 and carries the wafers 14 into an empty pod 16 set on the pod opener 24. Thereafter, the pod carrying device 20 carries the pod 16 in which the wafers 14 are accommodated to the pod shelf 22 or the pod stage 18. In this way, the sequence of operations of the semiconductor manufacturing apparatus 10 is completed.

According to the current embodiment, at least one of the following effects can be attained.

(1) Owing to the installation of the insulator 53, heat transfer from the heating target object 48 to the reaction tube 42 or the outside of the reaction tube 42 can be suppressed.

(2) In addition, since the amount of heat dissipation from the heating target object 48 can be reduced owing to the insulator 53, the output of the induction coil 50 can be largely saved.

(3) In addition, the inside temperature of the reaction chamber 44 can be easily stabilized.

(4) Owing to the above-mentioned effects, through a single process, SiC epitaxial films can be formed on a plurality of substrates disposed in the reaction chamber 44.

Second Embodiment

Next, a second embodiment will be described.

Figure 8:
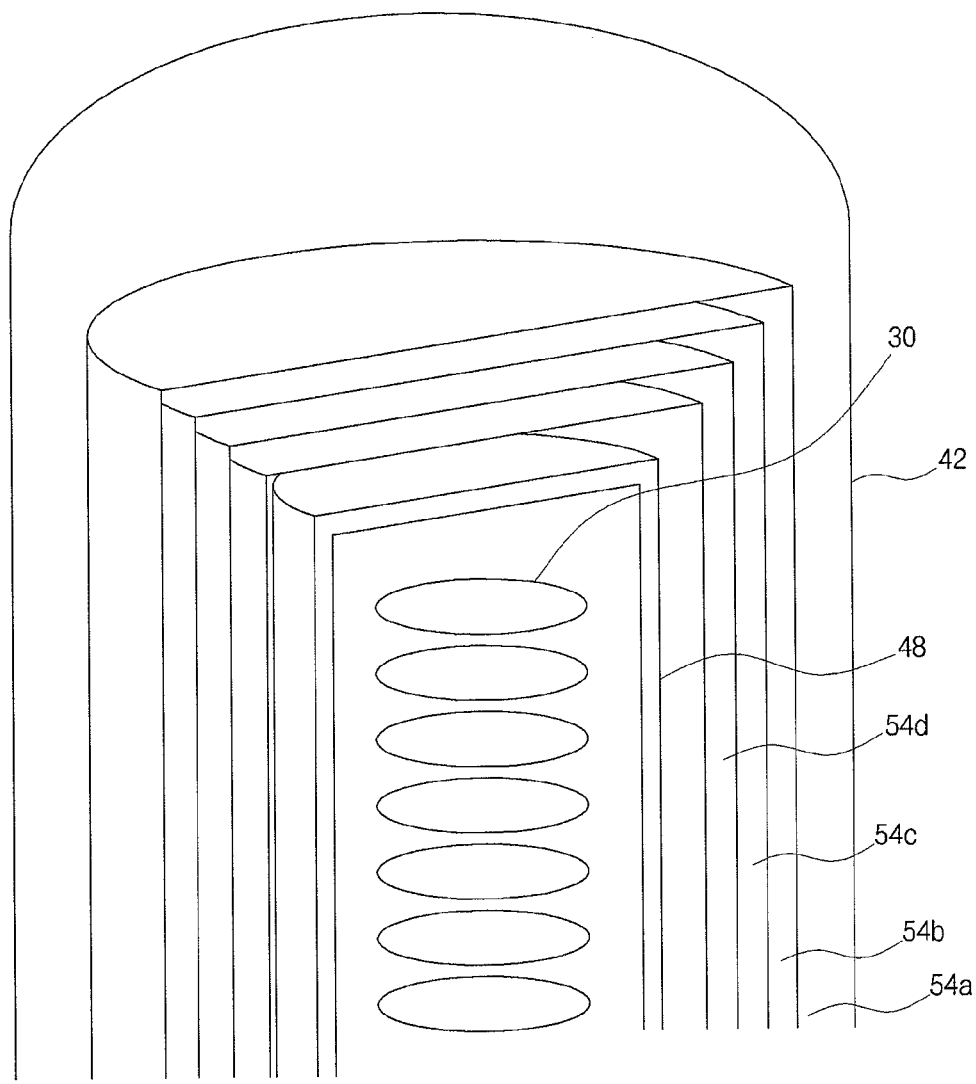
FIG. 8 is a side sectional view illustrating insulators 54 of a semiconductor manufacturing apparatus 10 according to a second embodiment of the present invention.
Figure 9:
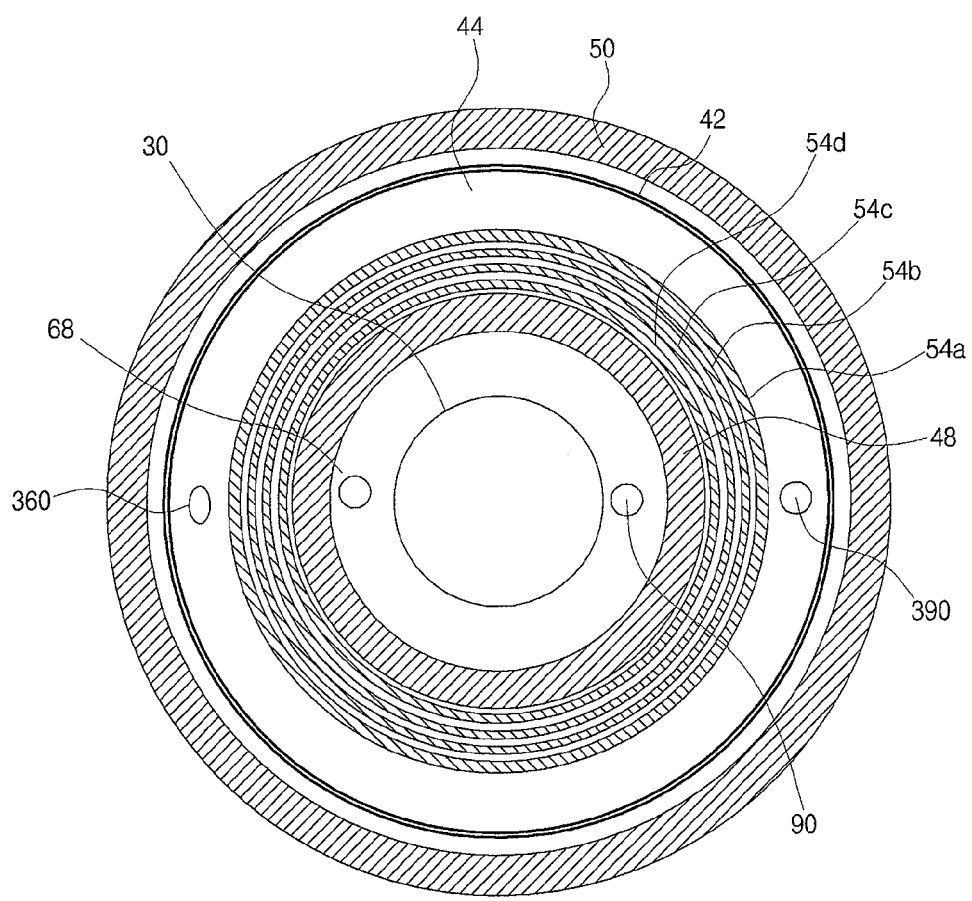
FIG. 9 is a cross-sectional view illustrating upper parts of the insulators 54 of the semiconductor manufacturing apparatus 10 according to the second embodiment of the present invention.

In the first embodiment, the insulator 53 is installed between the reaction tube 42 and the heating target object 48 so as to suppress heat transfer from the heating target object 48 to the reaction tube 42 or the outside of the reaction tube 42. However, in the second embodiment, as shown in FIG. 8 and FIG. 9, a plurality of cylindrical insulators 53 (for conciseness, only sidewall parts 54a to 54d of the insulators 53 are shown in FIG. 8) are installed in multiple layers so that predetermined spaces can be formed between the insulators 53.

Materials having a low thermal conductivity are generally used for making insulators, and in the present invention, carbon felt is used in this embodiment. By increasing the thickness of the insulator 53 to improve insulting performance, heat transfer caused by thermal conduction of the insulator 53 can be suppressed, and thus heat transfer from the heating target object 48 to the reaction tube 42 can be reduced.

However, when the heating target object 48 is induction-heated by the induction coil 50, it is difficult to control the inside temperature of the reaction chamber 44 if the insulator 53 is thick. For example, when the reaction chamber 44 is cooled after SiC epitaxial films are formed, the inside temperature of the process furnace 40 may not be easily reduced although power to the induction coil 50 is interrupted. In this case, wafers 14 may not be easily cooled to a predetermined temperature, and thus it may take considerable time until the wafers 14 are unloaded. In addition, the insulator 53 may generate heat by electromagnetic induction.

To solve this problem, the insulator 53 may be formed to have a small thickness by using a material having a high electric resistance. However, in this case, the above-described insulating performance may not be guaranteed.

Thus, in the second embodiment, as shown in FIG. 8 and FIG. 9, thin cylindrical insulators 53 are made of a material resistant to a high temperature, and the insulators 53 are installed in multiple layers.

Figure 10:
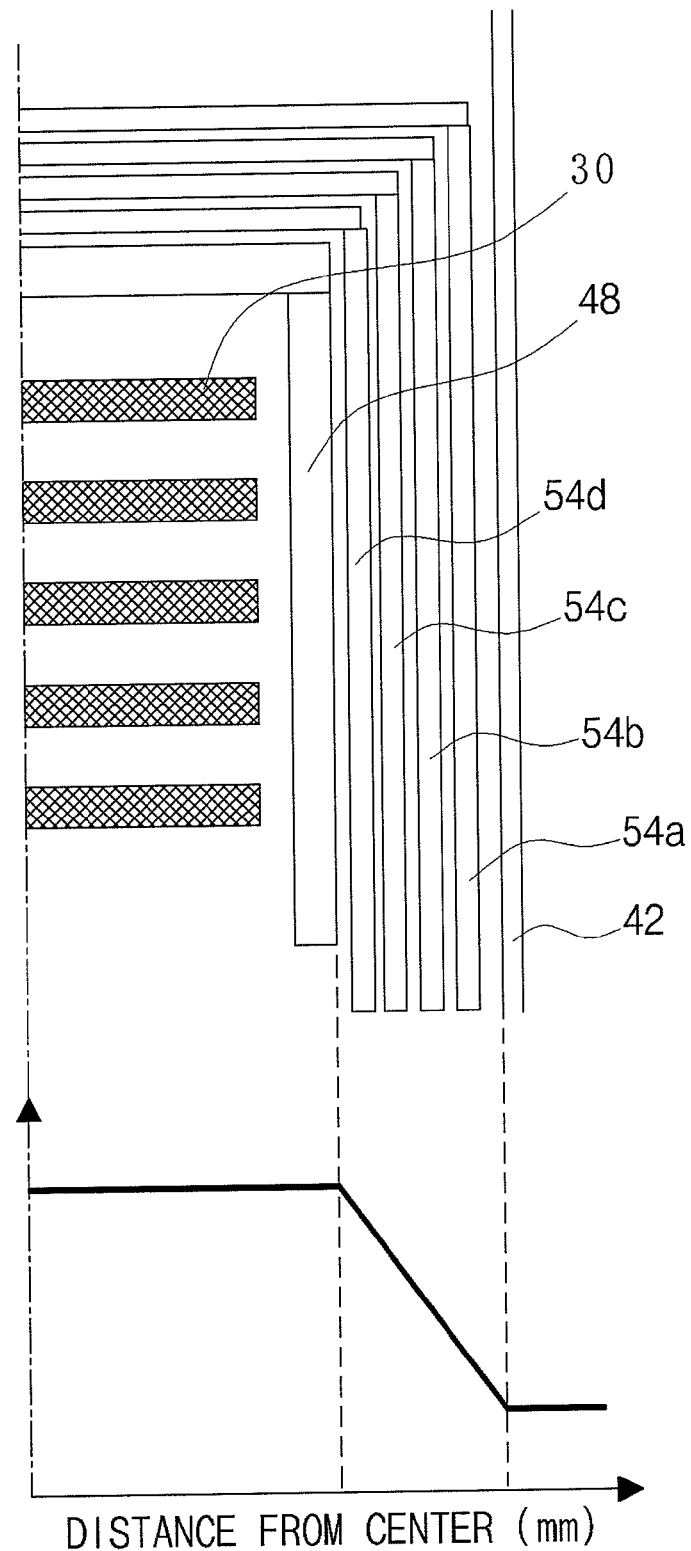
FIG. 10 is a view illustrating temperature distribution of a process furnace 40 at the inside of the insulators 54 in the semiconductor manufacturing apparatus 10 of the second embodiment of the present invention.

As shown in FIG. 10, the sidewall parts 54a to 54d installed in multiple layers can efficiently prevent heat transfer from the inside of the reaction chamber 44 kept at a high temperature to the reaction tube 42 or the outside of the reaction tube 42.

For example, if the temperature of the heating target object 48 which is a heat source is $T_1$ and the temperature of the sidewall part 54d is $T_2$, the amount of heat $Q_1$ which transfers from the heating target object 48 (heat source) to the sidewall part 54d by radiation can be expressed by Formula 1 below.

$$Q_1 = A\epsilon\sigma(T_1^4 - T_2^4)$$ [Formula 1]

where A denotes surface area, $\epsilon$ denotes emissivity, and $\sigma$ denotes Stefan-Boltzmann's constant.

Similarly, if the temperature of the sidewall part 54c is $T_3$, the temperature of the sidewall part 54b is $T_4$, . . . , and the temperature of a $n^{th}$ sidewall part 54n from the inside is $T_n$, the amount of heat which transfers between the insulators can be expressed by Formula 2 below.

$$Q_2 = A\epsilon\sigma(T_2^4 - T_3^4),\ Q_3 = A\epsilon\sigma(T_3^4 - T_4^4),\ \ldots,\ Q_n = A\epsilon\sigma(T_n^4 - T_\infty^4)$$ [Formula 2]

where n is an integer, and $T_\infty$ denotes ambient temperature.

If $Q_1$ to $Q_n$ are added up in Formula 2, Formula 3 can be obtained as shown below.

$$Q_1 + Q_2 + Q_3 + \ldots + Q_n = A\epsilon\sigma(T_1^4 - T_\infty^4)$$ [Formula 3]

Here, since $Q_1 = Q_2 = Q_3 = \ldots = Q_n$, if $Q_1, Q_2, Q_3, \ldots, Q_n$ are denoted by Q, Formula 4 can be obtained as shown below.

$$nQ = A\varepsilon\sigma(T_1^4 - T_\infty^4)$$ [Formula 4]
$$\therefore Q = \frac{A\varepsilon\sigma(T_1^4 - T_\infty^4)}{n}$$

That is, if the number of insulators surrounding the heat source is n, the amount of heat Q discharged to the outside from the heat source by radiation becomes 1/n times the amount of heat that is discharged when a single insulator is used. This is independent of the heat conductivity or thickness of insulators. It is preferable that an insulator has low emissivity; however, in opposite cases, insulating performance can be controlled by increasing the number of insulators. In addition, the thickness of the insulators can be reduced so as to prevent the insulators from being affected by induction. That is, in the case of using the above-described method, properties other than heat resistance may be less considered when selecting a material for the insulators, and thus a material for the insulators can be selected from a wide range of materials. In addition, if gas having a temperature lower than an in-furnace temperature is supplied from an outside area to spaces between a plurality of insulators, time necessary for reducing the in-furnace temperature to a predetermined temperature can be reduced.

In the second embodiment, as shown in FIG. 9 and FIG. 10, four cylindrical insulators are installed in multiple layers. However, the present invention is not limited thereto. For example, three or more insulators may be installed.

In addition, the insulators 53 may not have a cylindrical shape. For example, the insulators 53 may have a multi-layer structure formed by dividing a cylindrical shape into two or more members and combining the divided members.

Figure 11:
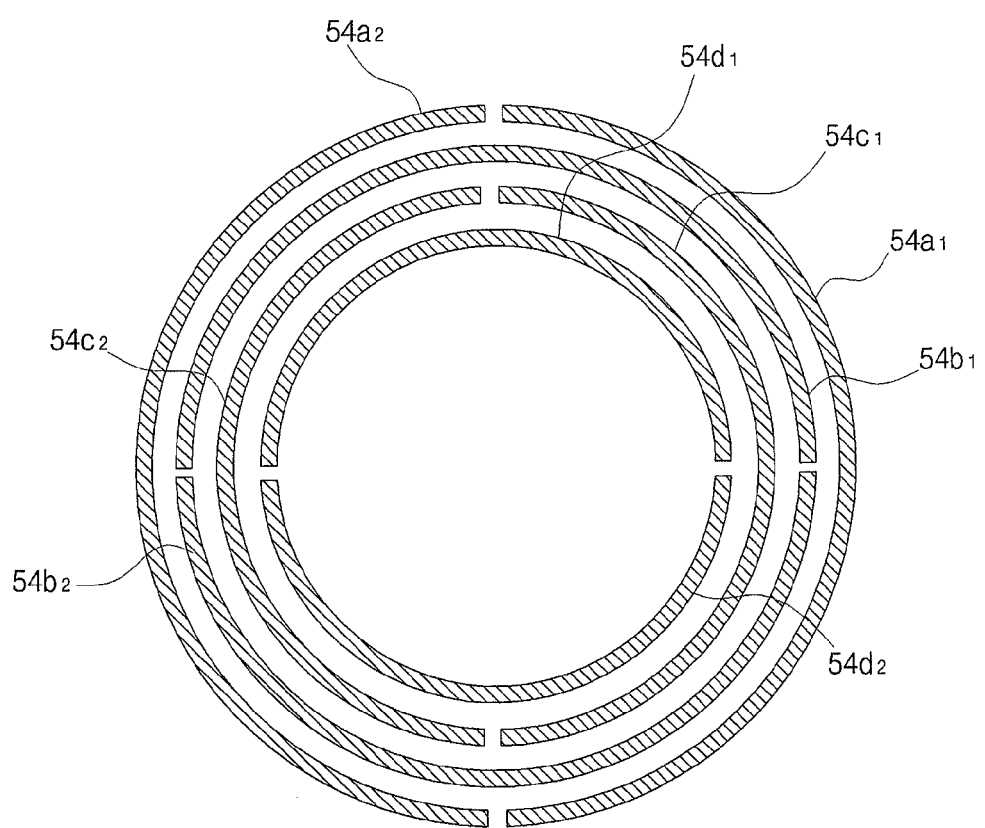
FIG. 11 is a view illustrating a structure of a modification example of the insulators 54 of the semiconductor manufacturing apparatus 10 according to the second embodiment of the present invention.
Figure 14:
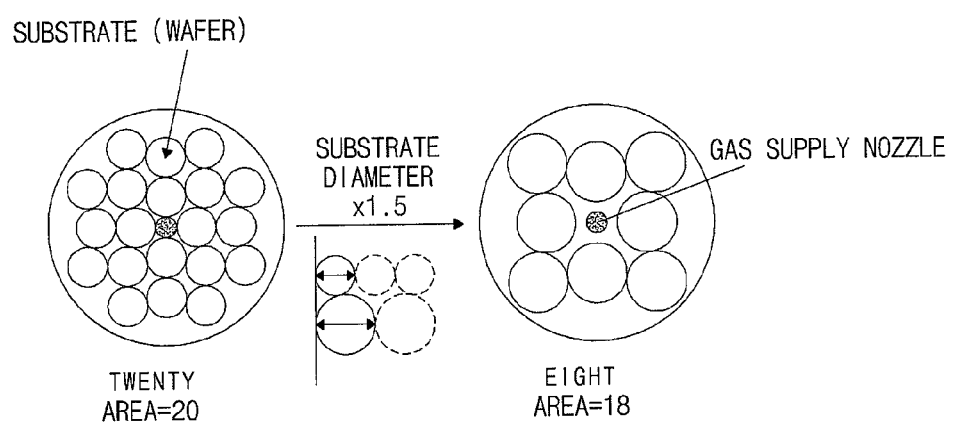
FIG. 14 is a schematic view illustrating a relationship between a pancake type susceptor and substrate positions.

Preferably, to block light passing through gaps formed between the combined members, as shown in FIG. 11, the gaps may be slightly shifted in the circumferential direction, and more preferably, arranged at an angle of 90°.

In this way, generation of an induced current through the insulators can be suppressed to prevent generation of heat from the insulators, and thus insulating effects can be improved. In addition, when a cooling gas having a temperature lower than an in-furnace temperature is supplied so as to rapidly decrease the in-furnace temperature, the cooling gas can be supplied to spaces between the insulators through the gaps between the combined members, and thus fewer supply inlets may be necessary for supplying the cooling gas. In addition, inert gas that can be supplied through the second gas supply inlet 360 (refer to FIG. 2) can be used as a cooling gas.

According to the current embodiment, at least one of the following effects can be attained in addition to the effects explained in the first embodiment.

(1) Since the insulators 53 are installed with predetermined spaces therebetween, heat transfer from the heating target object 48 to the reaction tube 42 or the outside of the reaction tube 42 by radiation can be suppressed by the multi-layer structure of the insulators 53.

(2) The thickness of insulators can be reduced and a necessary insulting region can be reduced, and along with these, heat generation from the insulators by induction can be prevented.

(3) By supplying a cooling gas to spaces between the insulators, an in-furnace temperature can be rapidly reduced.

Third Embodiment

Next, a third embodiment will be described.

In the first embodiment, the insulator 53 is installed between the reaction tube 42 and the heating target object 48 so as to suppress heat transfer from the heating target object 48 to the reaction tube 42 or the outside of the reaction tube 42. However, as shown in FIG. 12A, in the case where the bottom side of the reaction chamber 44 is opened and the top side of the reaction chamber 44 is closed, if the insulator 53 of the first embodiment is used, temperature distribution of the heating target object 48 is varied when the heating target object 48 is heated. That is, as show in FIG. 12B, the temperature distribution of the heating target object 48 is varied in the vertical direction when the heating target object 48 is heated.

Therefore, in the third embodiment, an insulator 53 includes a sidewall part 54 the thickness of which varies. For example, the thickness of the sidewall part 54 is sloped in the vertical direction as shown in FIG. 12C. As shown in FIG. 12C, if the thickness of the sidewall part 54 is d1 (millimeter (mm)) at an upper end part, d (mm) at a middle part, and d2 (mm) at a lower end part, the entire thickness of the sidewall part 54 is sloped in a way of d1<d<d2.

In this way, temperature distribution of wafers 14 can be uniformly maintained in the vertical direction when the wafers 14 are heated, and the output power distribution of the induction coil 50 which is an induction heating source can be kept at a low level. In addition, the lifetime of the induction coil 50 can be increased.

However, the present invention is not limited to the third embodiment. For example, the thickness of the sidewall part 54 may be sloped in a manner such that the upper part of the sidewall part 54 is thick and the lower part of the sidewall part 54 is relatively thin.

In addition, the present invention is not limited to the exemplary shape of the sidewall part 54 in which the upper part of the sidewall part 54 is thinner than the middle part of the sidewall part 54, and the lower part of the sidewall part 54 is thicker than the middle part of the sidewall part 54. For example, in the case of a reaction chamber 44 shown in FIG. 13A, the temperature of wafers 14 may be distributed as shown in FIG. 13B. In this case, as shown in FIG. 13C, an insulator the thickness of which is thicker at its upper and lower parts can be used to keep the temperature distribution of wafers 14 uniform in the vertical direction when the wafers 14 are heated.

In the current embodiment, the sidewall part 54 is entirely sloped. However, as long as the vertical temperature distribution of wafers 14 can be kept uniform when the wafers 14 are heated, the shape of the sidewall part 54 is not limited to a particular shape but can be varied. For example, the sidewall part 54 may have a stepped part, which protrudes outward from the outer wall of the sidewall part 54 or inward from the inner wall of the sidewall part 54. In this way, the temperature controllability of a region where wafers 14 are disposed can be improved, and the insulator 53 can be easily manufactured with lower costs into a shape suitable for reducing heat dissipation through the opened lower side of the insulator 53.

According to the current embodiment, at least one of the following effects can be attained in addition to the effects explained in the first and second embodiments.

(1) By sloping the thickness of the sidewall part 54, the vertical temperature distribution of wafers 14 can be kept uniform.

(2) In addition, since the temperature distribution of wafers 14 can be kept uniform by using the sidewall part 54, temperature control can be easily carried out during induction heating.

(3) In addition, the output power of the induction coil 50 can be uniformly controlled, and the lifetime of the induction coil 50 can be increased.

Although SiC epitaxial growth has been explained, the present invention can be applied to other epitaxial film growth or chemical vapor deposition (CVD) film growth.

As described above, the present invention provides a method of manufacturing a semiconductor device, a method of manufacturing a substrate, and substrate processing apparatus, for forming films having a uniform thickness on a plurality of substrates.

[Supplementary Note]

The present invention also includes the following embodiments.

[Supplementary Note 1]

According to an embodiment of the present invention, there is provided a substrate processing apparatus comprising: a reaction chamber configured to process a substrate; a heating target object disposed in the reaction chamber to surround at least a region where the substrate is disposed, the heating target object having a cylindrical shape with a closed end; an insulator disposed between the reaction chamber and the heating target object to surround the heating target object, the insulator having a cylindrical shape with a closed end at a same side as the closed end of the heating target object; an induction heating unit disposed outside the reaction chamber to surround at least the region where the substrate is disposed; a first gas supply system configured to supply at least a source gas into the reaction chamber; and a controller configured to control the first gas supply system so that the first gas supply system supplies at least the source gas into the reaction chamber for processing the substrate.

[Supplementary Note 2]

In the Supplementary Note 1, the insulator may comprise: a cylindrical sidewall part; and a cover part configured to close an end of the sidewall part, wherein the sidewall part and the cover part may be different members.

[Supplementary Note 3]

In the Supplementary Note 1, the insulator may comprise: a cylindrical sidewall part; and a cover part configured to close an end of the sidewall part, wherein the sidewall part may have a greater thickness at a lower or upper end where the cover part is provided than at the region where the substrate is disposed.

[Supplementary Note 4]

In the Supplementary Note 1, the insulator may comprise: a cylindrical sidewall part; and a cover part configured to close an end of the sidewall part, wherein the cover part may have a greater thickness at a center part than at a peripheral part.

[Supplementary Note 5]

In the Supplementary Note 1, the insulator may comprise: a cylindrical sidewall part; and a cover part configured to close an end of the sidewall part, wherein the induction heating unit may extend from the region where the substrate is disposed to at least the cover part.

[Supplementary Note 6]

In the Supplementary Note 1, the insulator may comprise: a cylindrical sidewall part; and a cover part configured to close an end of the sidewall part, wherein the induction heating unit may have a greater induced current density at the end of the sidewall part where the cover part is provided or the other end of the sidewall part than at the region where the substrate is disposed.

[Supplementary Note 7]

In the Supplementary Note 1, the insulator may comprise: a cylindrical sidewall part; and a cover part configured to close an end of the sidewall part, wherein the induction heating unit may have a greater induced current density at the other end of the sidewall part than at the end of the sidewall part where the cover part is provided.

[Supplementary Note 8]

In the Supplementary Note 1, the insulator may comprise a plurality of insulating members, wherein spaces may be formed between the insulating members.

[Supplementary Note 9]

The substrate processing apparatus of the Supplementary Note 8 may further comprise a second gas supply system configured to supply a gas to the spaces between the insulating members.

[Supplementary Note 10]

In the Supplementary Note 8, each of the insulating members may comprise a plurality of first members surrounding the heating target object, and gaps may be formed between the first members.

[Supplementary Note 11]

According to another embodiment of the present invention, there is provided a method of manufacturing a semiconductor device, the method comprising: loading a substrate into a cylindrical heating target object disposed in a cylindrical insulator installed in a reaction chamber, the heating target object having a closed end at a same side as a closed end of the cylindrical insulator; and processing the substrate by heating the heating target object using an induction heating unit installed around the reaction chamber while suppressing heat dissipation from the heating target object to an outside area by using the insulator, and by supplying at least a source gas into the heating target object.

[Supplementary Note 12]

According to another embodiment of the present invention, there is provided a method of manufacturing a substrate, the method comprising: loading a substrate into a cylindrical heating target object disposed in a cylindrical insulator installed in a reaction chamber, the heating target object having a closed end at a same side as a closed end of the cylindrical insulator; and processing the substrate by heating the heating target object using an induction heating unit installed around the reaction chamber while suppressing heat dissipation from the heating target object to an outside area by using the insulator, and by supplying at least a source gas into the heating target object.

The present invention can be applied to a method of manufacturing a semiconductor device, a method of manufacturing a substrate, and a substrate processing apparatus, which use a substrate processing process, particularly, a process of forming a SiC epitaxial film on a substrate.

What is claimed is:

1. A substrate processing apparatus comprising:
   a reaction chamber configured to process a substrate;
   a heating target object disposed in the reaction chamber to surround at least a region where the substrate is disposed, the heating target object having a cylindrical shape with a closed end;
   an insulator disposed between the reaction chamber and the heating target object to surround the heating target object,
   wherein the insulator is made of a material different from that of the heating target object and has a cylindrical shape with a closed end at a same side as that of the heating target object, and
   wherein the insulator comprises:
      a plurality of first members arranged along a circumferential direction of the insulator with first gaps therebetween; and
      a plurality of second members arranged along the circumferential direction with second gaps therebetween so as to surround the plurality of first members, the second gaps being circumferentially shifted with respect to the first gaps;
   an induction heating unit disposed outside the reaction chamber to surround at least the region where the substrate is disposed;
   a first gas supply system configured to supply at least a source gas into the reaction chamber; and
   a controller configured to control the first gas supply system so that the first gas supply system supplies at least the source gas into the reaction chamber for processing the substrate.

2. The substrate processing apparatus of claim 1,
   wherein the insulator comprises: a cylindrical sidewall part; and a cover part configured to close an end of the sidewall part, and
   wherein the sidewall part and the cover part are different members.

3. The substrate processing apparatus of claim 1,
   wherein the insulator comprises: a cylindrical sidewall part; and a cover part configured to close an end of the sidewall part, and
   wherein the sidewall part has a greater thickness at a lower or upper end where the cover part is provided than at the region where the substrate is disposed.

4. The substrate processing apparatus of claim 1,
   wherein the insulator comprises:
   a cylindrical sidewall part; and a cover part configured to close an end of the sidewall part, and
   wherein the cover part has a greater thickness at a center part than at a peripheral part.

5. The substrate processing apparatus of claim 1,
   wherein the insulator comprises: a cylindrical sidewall part; and a cover part configured to close an end of the sidewall part, and
   wherein the induction heating unit extends from the region where the substrate is disposed to at least the cover part.

6. The substrate processing apparatus of claim 1,
   wherein the insulator comprises: a cylindrical sidewall part; and a cover part configured to close an end of the sidewall part, and
   wherein the induction heating unit has a greater induced current density at the end of the sidewall part where the cover part is provided or the other end of the sidewall part than at the region where the substrate is disposed.

7. The substrate processing apparatus of claim 1,
   wherein the insulator comprises: a cylindrical sidewall part; and a cover part configured to close an end of the sidewall part, and
   wherein the induction heating unit has a greater induced current density at the other end of the sidewall part than at the end of the sidewall part where the cover part is provided.

8. The substrate processing apparatus of claim 1, wherein the material different from that of the heating target object is resistant to induction heating.

9. The substrate processing apparatus of claim 8, wherein the material different from that of the heating target object is resistant to thermal conduction.

10. The substrate processing apparatus of claim 9, wherein the material different from that of the heating target object comprises carbon felt.

* * * * *